(12) United States Patent
Wolk et al.

(10) Patent No.: US 8,957,322 B2
(45) Date of Patent: Feb. 17, 2015

(54) CONDUCTIVE FILMS HAVING LOW-VISIBILITY PATTERNS AND METHODS OF PRODUCING THE SAME

(71) Applicant: Cambrios Technologies Corporation, Sunnyvale, CA (US)

(72) Inventors: Jeffrey Wolk, Half Moon Bay, CA (US); Michael R. Knapp, Hillsborough, CA (US)

(73) Assignee: Cambrios Technologies Corporation, Sunnyvale, CA (US)

( * ) Notice: Subject to any disclaimer, the term of this patent is extended or adjusted under 35 U.S.C. 154(b) by 152 days.

(21) Appl. No.: 13/791,086

(22) Filed: Mar. 8, 2013

(65) Prior Publication Data
US 2014/0158400 A1    Jun. 12, 2014

Related U.S. Application Data

(60) Provisional application No. 61/734,811, filed on Dec. 7, 2012.

(51) Int. Cl.
| | |
|---|---|
| H05K 1/11 | (2006.01) |
| H05K 3/02 | (2006.01) |
| H05K 1/02 | (2006.01) |
| H05K 3/06 | (2006.01) |
| H01B 1/22 | (2006.01) |
| H05K 3/00 | (2006.01) |

(52) U.S. Cl.
CPC ............... *H05K 1/0296* (2013.01); *H05K 3/06* (2013.01); *H01B 1/22* (2013.01); *H05K 3/0085* (2013.01)
USPC ............................. 174/261; 29/846; 174/257

(58) Field of Classification Search
USPC ...................... 174/255–261; 29/846
See application file for complete search history.

(56) References Cited

U.S. PATENT DOCUMENTS

| | | | |
|---|---|---|---|
| 6,975,067 B2 | 12/2005 | McCormick et al. | |
| 8,018,569 B2 | 9/2011 | Goodhill et al. | |
| 2007/0074316 A1 | 3/2007 | Alden et al. | |
| 2008/0143906 A1 | 6/2008 | Allemand et al. | |
| 2008/0210052 A1 | 9/2008 | Allemand | |
| 2008/0233675 A1 | 9/2008 | Lee et al. | |
| 2009/0129004 A1 | 5/2009 | Gruner | |
| 2009/0223703 A1 | 9/2009 | Winoto | |
| 2009/0283304 A1 | 11/2009 | Winoto | |
| 2010/0243295 A1 | 9/2010 | Allemand et al. | |
| 2011/0024159 A1 | 2/2011 | Allemand et al. | |
| 2011/0045272 A1 | 2/2011 | Allemand | |
| 2011/0048170 A1 | 3/2011 | Bhatia et al. | |
| 2011/0253668 A1 | 10/2011 | Winoto et al. | |
| 2012/0104374 A1 | 5/2012 | Allemand | |

FOREIGN PATENT DOCUMENTS

| | | |
|---|---|---|
| WO | 2006/091823 A2 | 8/2006 |
| WO | 2011/106438 A1 | 9/2011 |

OTHER PUBLICATIONS

Sun et al., "Crystalline Silver Nanowires by Soft Solution Processing," Nano Letters 2(2): 165-168, 2002.

*Primary Examiner* — Jeremy C Norris
(74) *Attorney, Agent, or Firm* — Seed IP Law Group PLLC

(57) ABSTRACT

A patterned transparent conductor including a conductive layer coated on a substrate is described. More specifically, the transparent conductor has low-visibility patterns.

16 Claims, 2 Drawing Sheets

CONDUCTIVE FILMS HAVING LOW-VISIBILITY PATTERNS AND METHODS OF PRODUCING THE SAME

BACKGROUND

Description of the Related Art

Transparent conductors refer to thin conductive films coated on high-transmittance surfaces or substrates. Transparent conductors may be manufactured to have surface conductivity while maintaining reasonable optical transparency. Such surface conducting transparent conductors are widely used as transparent electrodes in flat liquid crystal displays, touch panels, electroluminescent devices, and thin film photovoltaic cells; as anti-static layers; and as electromagnetic wave shielding layers.

Currently, vacuum deposited metal oxides, such as indium tin oxide (ITO), are the industry standard materials to provide optical transparency and electrical conductivity to dielectric surfaces such as glass and polymeric films. However, metal oxide films are fragile and prone to damage when bent or otherwise subjected to physical stresses. They also require costly processes and specialized equipment to fabricate. Metal oxide films are typically deposited in vacuum chambers at elevated deposition temperatures as well as high annealing temperatures to achieve the requisite conductivity. Moreover, vacuum deposition is not conducive to directly forming patterns and circuits, which necessitates specialized patterning processes such as photolithography.

The specialized processes for fabricating metal oxide films put severe limitations on the substrates. Typically, rigid substrates such as glass are the only practical choices. Flexible substrates (e.g., plastic), on the other hand, often fail to adhere to metal oxide as a result of moisture absorption by the substrate.

Conductive polymers have also been used as optically transparent electrical conductors. However, they generally have lower conductivity values and higher optical absorption (particularly at visible wavelengths) compared to the metal oxide films, and suffer from lack of chemical and long-term stability.

Accordingly, there remains a need in the art to provide transparent conductors having desirable electrical, optical and mechanical properties; in particular, transparent conductors that are adaptable to any substrates and can be manufactured and patterned in a low-cost, high-throughput process.

BRIEF SUMMARY

A patterned transparent conductor including a conductive layer coated on a substrate is described. More specifically, the patterned transparent conductor comprising: a non-conductive substrate; a first conductive line on the non-conductive substrate, the first conductive line comprising a first network of conductive nanostructures and having a first lengthwise direction; a second conductive line on the non-conductive substrate, the second conductive line comprising a second network of conductive nanostructures and having a second lengthwise direction; and an insulating region electrically isolating the first conductive line from the second conductive line, the insulating region having a first non-conductive boundary laterally abutting the first conductive line along the first lengthwise direction and a second non-conductive boundary laterally abutting the second conductive line along the second lengthwise direction, wherein the insulating region comprises a plurality of conductive material islands disposed on the non-conductive substrate and electrically isolated from each other by non-conductive gaps, each conductive material island comprising a respective plurality of conductive nanostructures, and wherein the non-conductive gaps, the first and second non-conductive boundaries do not have any conductive network of metal nanostructures.

In a further embodiment, in the patterned transparent conductor, the first lengthwise direction and the second lengthwise direction are substantially parallel to each other.

In various embodiments, the first non-conductive boundary may be straight or irregular. The second non-conductive boundary may be straight or irregular.

In other embodiments, the conductive material islands may be parallelogram-shaped, or may be irregular-shaped.

In further embodiments, the conductive material islands have surface areas that are within the range of 0.1-10 $mm^2$ or 0.5-2 $mm^2$.

In various embodiments, no metal nanostructures are present in the non-conductive gaps, the first and second non-conductive boundaries.

In other embodiments, the non-conductive gaps, the first and second non-conductive boundaries have metal nanostructures with structural defects that render them incapable of forming a conductive network.

A further embodiment provides a process of fabricating a transparent conductor with a low-visibility pattern, the process comprising: directly printing a coating composition on a non-conductive substrate according to a pattern, the coating composition having a plurality of metal nanostructures and a volatile liquid carrier; and removing the volatile liquid carrier, wherein, the pattern defines a first conductive line having a first lengthwise direction on the non-conductive substrate; a second conductive line having a second lengthwise direction on the non-conductive substrate, and an insulating region electrically isolating the first conductive line from the second conductive line, the insulating region having a first non-conductive boundary laterally abutting the first conductive line along the first lengthwise direction and a second non-conductive boundary laterally abutting the second conductive line along the second lengthwise direction, wherein, the insulating region comprises a plurality of conductive material islands disposed on the non-conductive substrate and electrically isolated from each other by non-conductive gaps, each conductive material island comprising a respective plurality of conductive nanostructures, and wherein the non-conductive gaps, the first and second non-conductive boundaries do not have any metal nanostructures.

Yet a further embodiment provides a process of fabricating a transparent conductor with a low-visibility pattern, the process comprising: coating a coating composition on a non-conductive substrate, the coating composition having a plurality of metal nanostructures and a volatile liquid carrier; removing the volatile liquid carrier to provide a conductive network of metal nanostructures; and etching the conductive network according to a pattern, wherein, the pattern defines a first conductive line having a first lengthwise direction on the non-conductive substrate; a second conductive line having a second lengthwise direction on the non-conductive substrate, and an insulating region electrically isolating the first conductive line from the second conductive line, the insulating region having a first non-conductive boundary laterally abutting the first conductive line along the first lengthwise direction and a second non-conductive boundary laterally abutting the second conductive line along the second lengthwise direction, wherein, the insulating region comprises a plurality of conductive material islands disposed on the non-conductive substrate and electrically isolated from each other by non-conductive gaps, each conductive material island comprising a respective plurality of conductive nanostructures, and wherein the non-conductive gaps, the first and second non-conductive boundaries do not have a conductive network of the metal nanostructures.

In one embodiment, the etching completely removes all of the metal nanostructures in the non-conductive gaps, the first and second non-conductive boundaries. In another embodiment, the etching partially etches the metal nanostructures in the non-conductive gaps, the first and second non-conductive boundaries to cause structural defects.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been selected solely for ease of recognition in the drawings.

DETAILED DESCRIPTION

Transparent conductive films are essential components in flat panel displays such as a touch screen or a liquid crystal display (LCD). They not only determine the electrical performance of these devices, but also have direct impact on optical performances and durability of these components.

For a touch screen sensor, whether it is capacitive or resistive, one or two transparent conductive films are employed to carry an electrical current underlying a touch panel. The transparent conductive films are patterned into conductive lines to detect the coordinate of the location of the touch input. When the touch panel is touched, a small change in the electrical voltage at the location of the touch input is detected (in a resistive touch sensor).

Conventionally, a transparent conductor may be patterned by etching or direct printing. Patterning thus creates electrically insulating regions where no conductive material is present, having been either removed by etching or not printed. The conductive regions and insulating regions in a patterned transparent conductor generally differ in their interactions with ambient light or the back light of the device. As a result, the pattern becomes visible.

When creating a pattern of conductive lines on a film for flat panel display, it is thus desirable to minimize the visibility of the pattern. For ITO-based transparent conductors, the patterns are visible due to the differences in refractive indices of ITO and the etched, insulating regions. Thus, index-matching coatings are often required as a countermeasure to the etched patterns of the ITO.

Figure 1:
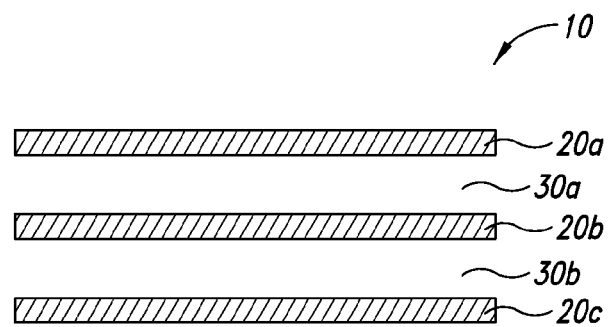
FIG. 1 shows a prior art transparent conductor in which patterns of conductive lines can be visible.

For conductive film comprising a network of metal nanowires, light scattering off the reflective metallic surface also contributes to the visibility of the pattern. FIG. 1 shows a section of a patterned transparent conductor (10) that includes conductive lines (20) that have a line width of 1 mm. Each two adjacent conductive lines are electrically isolated by a 3-mm wide insulating region (30) that has no metal nanostructures. At these dimensions, the patterns are often visible because of the differences in the amounts of light scattering in the conductive regions (20) as compared to the insulating regions (30).

One approach to minimizing the visibility of the pattern is to minimize the optical difference between the conductive and the insulating regions. U.S. Pat. No. 8,018,569 and U.S. Published Application No. 2008/0143906 describe a transparent conductor with a low-visibility pattern created by partially etching the nanowires to provide the insulating regions. The partial etch does not completely remove the nanowires. Rather, it breaks or creates nicks in the nanostructures, rendering them non-conductive yet not substantially changing their light scattering properties.

Disclosed herein are alternative approaches to minimizing the optical difference between the conductive regions and the insulating regions. In particular, low-visibility or invisible patterns are created through "low visibility or invisibility by islands." In various embodiments, conductive lines (composed of metal nanostructures) are electrically isolated from each other by insulating regions. The insulating region is not devoid of conductive material. Rather, the insulating region is largely filled with conductive material islands (i.e., also composed of metal nanowires), which are electrically isolated from each other by non-conductive gaps. This approach effectively minimizes the overall non-conductive areas that have no light-scattering nanostructures, thus making them more difficult to visualize. Meanwhile, electrical isolation between the conductive lines is maintained by the non-conductive gaps.

Thus, the present disclosure provides a patterned transparent conductor comprising:

a substrate, a first conductive line on the substrate, the first conductive line comprising a first network of conductive nanostructures and having a first lengthwise direction;

a second conductive line on the substrate, the second conductive line comprising a second network of conductive nanostructures and having a second lengthwise direction; and an insulating region electrically isolating the first conductive line from the second conductive line, the insulating region having a first non-conductive boundary laterally abutting the first conductive line along the first lengthwise direction and a second non-conductive boundary laterally abutting the second conductive line along the second lengthwise direction, wherein the insulating region comprises a plurality of conductive material islands disposed on the non-conductive substrate and electrically isolated from each other by non-conductive gaps, each conductive material island comprising a respective plurality of conductive nanostructures, and wherein the non-conductive gaps, the first and second non-conductive boundaries do not have any conductive network of metal nanostructures.

Figure 2:
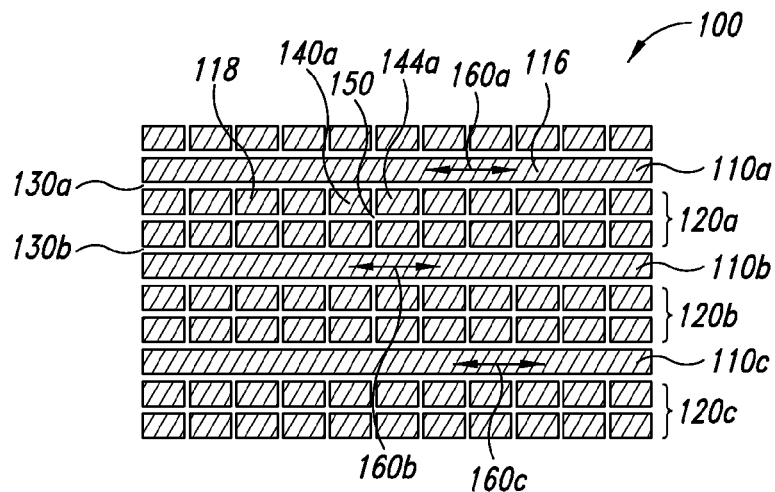
FIG. 2-4 show transparent conductors with invisible or low-visibility patterns according to various embodiments of this disclosure.
Figure 3:
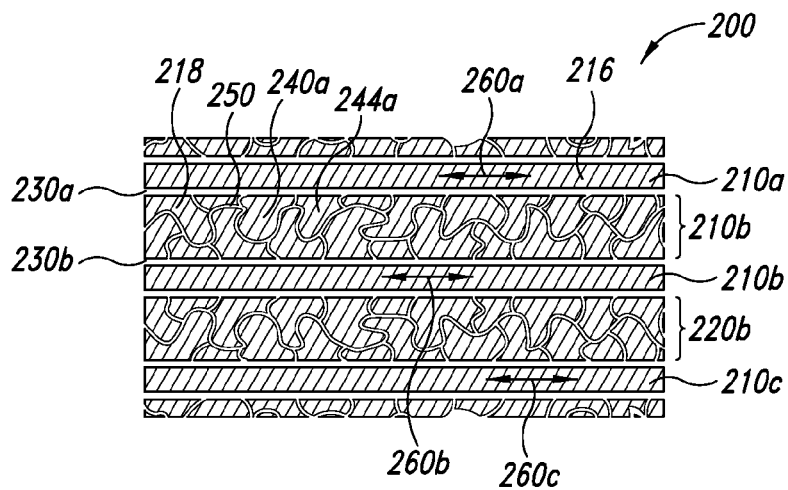
Figure 4:
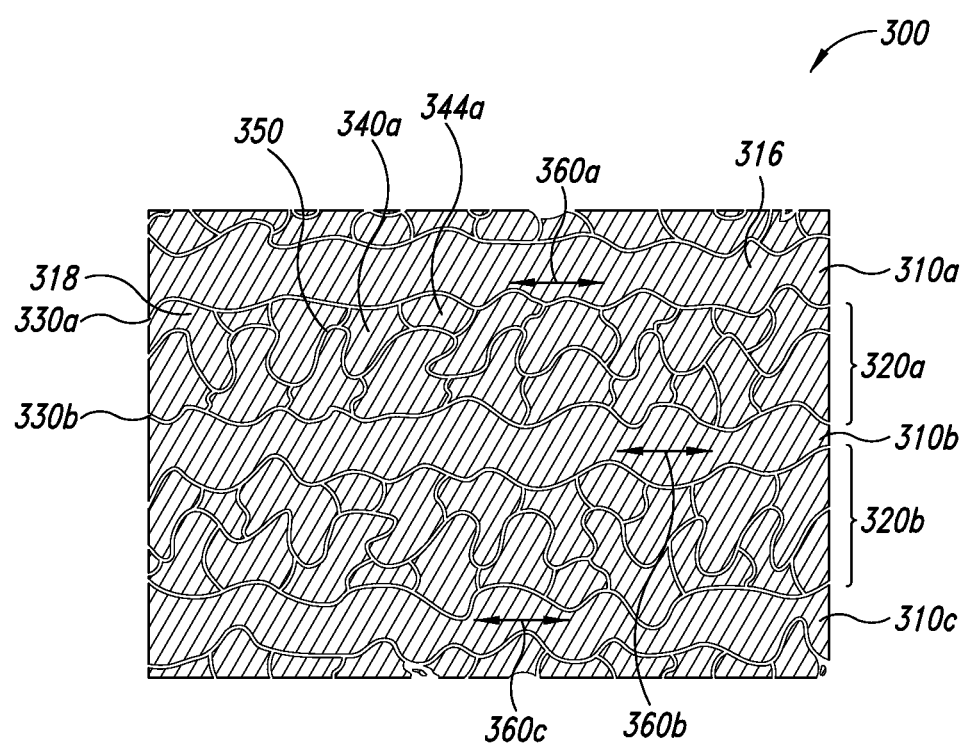

FIGS. 2-4 show specific embodiments directed to the "invisibility by island" approach. FIG. 2 shows a patterned transparent conductor (100) comprising conductive lines (110a, 110b, 110c) composed of networks of metal nanostructures (116). Two adjacent conductive lines are electrically isolated by an insulating region (120a, 120b or 120c). The insulating region (120a) abuts the two adjacent conductive lines (110a and 110b) by a first non-conductive boundary (130a) and a second non-conductive boundary (130b), respectively. The insulating region (e.g., 120a) further comprises a plurality of conductive material islands (e.g., 140a, 144a), each being composed of metal nanostructures (118). In this embodiment, the conductive material islands are regular shaped parallelograms (including rectangles, squares, rhomboids, rhombuses, etc) and the first and second non-conductive boundaries are substantially straight and parallel to the lengthwise direction (160a, 160b, 160c) of the conductive lines (110a, 110b, 110c), respectively. The conductive material islands are electrically isolated from each other by non-conductive gaps (150).

As shown in FIG. 2, the conductive material islands do make the patterned conductive lines less visible when compared to the conductive lines of FIG. 1. However, because the human brain is remarkable in discerning patterns, depending on the viewing conditions (e.g., lighting, angle of view), a viewer may still be able to discern a regular pattern such as the rows of rectangular islands in FIG. 2.

Thus, in a further specific embodiment, the conductive material islands are irregular-shaped. In other words, the non-conductive gaps are irregular and random. Shown in FIG. 3, a patterned transparent conductor (200) has conductive lines (210a, 210b, 210c) composed of networks of metal nanostructures (216). Two adjacent conductive lines are electrically isolated by an insulating region (220a, 220b). The insulating region (220a) abuts the two adjacent conductive lines (210a and 210b) by a first non-conductive boundary (230a) and a second non-conductive boundary (230b), respectively. The insulating region (e.g., 220a) further comprises a plurality of conductive material islands (e.g., 240a, 244a), each being composed of metal nanostructures (218). In this embodiment, although the first and second non-conductive boundaries that define the conductive lines are substantially straight and parallel to the lengthwise direction (260a, 260b, 260c) of the conductive lines (210a, 210b, 210c), respectively, the conductive material islands do not have a discernible pattern as to their individual shapes and sizes, which means that the non-conductive gaps (250) that electrically isolate any adjacent islands are also irregular.

In yet a further specific embodiment, the conductive material islands are irregular-shaped, as are the non-conductive boundaries that define the conductive lines. In this embodiment, despite the irregular and random shapes of the islands and the boundaries that define the conductive lines, a transparent conductor is still considered "patterned" as it provides conductive lines that extend in substantially the same lengthwise direction. Shown in FIG. 4, a patterned transparent conductor (200) has conductive lines (310a, 310b, 310c) composed of networks of metal nanostructures (316). Two adjacent conductive lines are electrically isolated by an insulating region (320a, 320b). The insulating region (320a) abuts the two adjacent conductive lines (310a and 310b) by a first non-conductive boundary (330a) and a second non-conductive boundary (330b), respectively. The insulating region (e.g., 320a) further comprises a plurality of conductive material islands (e.g., 340a, 344a), each being composed of metal nanostructures (318). In this embodiment, the first and second non-conductive boundaries that define the conductive lines are irregular, but are generally extending along the lengthwise directions (360a, 360b, 360c) of the conductive lines (310a, 310b, 310c), respectively. The conductive material islands (e.g., 340a, 340b) do not have a discernible pattern as to their individual shapes and sizes, which means that the non-conductive gaps (350) that electrically isolate any adjacent islands are also irregular-shaped. The combined effects of the irregular boundaries of the conductive lines as well as the random shapes of the conductive material islands disrupt the human brain's ability to recognize patterns, while minimizing the optical differences between the conductive lines and the insulating regions. As a result, the pattern of the conductive lines is invisible or has a low visibility.

In each of the embodiments described herein, no conductive networks of nanostructures are present in the non-conductive boundaries and the non-conductive gaps (collectively "non-conductive areas"), resulting in electrical isolation between any adjacent conductive material islands (e.g., 140a and 144a) or between the conductive line (110a) and an adjacent conductive material island (140a).

In certain embodiments, no conductive network is present in the non-conductive areas because no metal nanostructures are present in the non-conductive areas, i.e., they are completely removed by etching or are not printed on the non-conductive areas.

In other embodiments, although metal nanostructures are present in the non-conductive areas, they are not forming a conductive network because of certain structural defects in the metal nanostructures. Specifically, the metal nanostructures in the non-conductive areas may be partially etched, resulting in broken or nicked nanostructures that are no longer capable of forming a conductive network. The non-conductive areas thus retain a certain amount of nanostructures without being conductive. The combined effects of partial etching and islands provide an improved level of low visibility.

Typically, the conductive lines (110a, 110b, 110c) may be 0.5-5 mm wide. In various embodiments, the line widths may be about 0.5 mm, 1 mm, 1.5 mm, 2 mm, 2.5 mm, 3 mm, 3.5 mm, 4 mm, 4.5 mm or 5 mm, or any range between any two of the above values.

The line widths of the non-conductive gaps, as well as the non-conductive boundaries, are determined by the specific etching or printing methods, as discussed in further detail herein. Typically, to minimize visibility while maintaining effective electrical isolation, the line width is about 10-500 microns, or more typically 100-500 microns. In certain embodiments, the line width is about 200 microns.

Regardless of the shapes of the conductive material islands (regular or random), they may be the same size or different. The surface areas of the conductive material island are typically within the range of 0.1-10 $mm^2$, or more typically within the range of 0.5-2 $mm^2$.

As used here, "about" refers to a range of values ±20% of a specified value. For example, the phrase "about 1 mm" may include a range of ±20% of 1 mm, namely, 0.8 to 1.2 microns.

Certain features of the present disclosure are further discussed in more detail below.

Metal Nanostructures

As used herein, "metal nanostructures" generally refer to electrically conductive nano-sized structures, at least one dimension of which (i.e., width or diameter) is less than 500 nm; more typically, less than 100 nm or 50 nm. In various embodiments, the width or diameter of the nanostructures are in the range of 10 to 40 nm, 20 to 40 nm, 5 to 20 nm, 10 to 30 nm, 40 to 60 nm, 50 to 70 nm.

The nanostructures can be of any shape or geometry. One way for defining the geometry of a given nanostructure is by its "aspect ratio," which refers to the ratio of the length and the width (or diameter) of the nanostructure. In certain embodiments, the nanostructures are isotropically shaped (i.e., aspect ratio=1). Typical isotropic or substantially isotropic nanostructures include nanoparticles. In preferred embodiments, the nanostructures are anisotropically shaped (i.e. aspect ratio≠1). The anisotropic nanostructure typically has a longitudinal axis along its length. Exemplary anisotropic nanostructures include nanowires (solid nanostructures having aspect ratio of at least 10, and more typically, at least 50), nanorod (solid nanostructures having aspect ratio of less than 10) and nanotubes (hollow nanostructures).

Lengthwise, anisotropic nanostructures (e.g., nanowires) are more than 500 nm, or more than 1 µm, or more than 10 µm in length. In various embodiments, the lengths of the nanostructures are in the range of 5 to 30 µm, or in the range of 15 to 50 µm, 25 to 75 µm, 30 to 60 µm, 40 to 80 µm, or 50 to 100 µm.

Metal nanostructures are typically a metallic material, including elemental metal (e.g., transition metals) or a metal compound (e.g., metal oxide). The metallic material can also be a bimetallic material or a metal alloy, which comprises two or more types of metal. Suitable metals include, but are not limited to, silver, gold, copper, nickel, gold-plated silver, platinum and palladium. It should be noted that although the present disclosure describes primarily nanowires (e.g., silver nanowires), any nanostructures within the above definition can be equally employed.

Typically, metal nanostructures are metal nanowires that have aspect ratios in the range of 10 to 100,000. Larger aspect ratios can be favored for obtaining a transparent conductor layer since they may enable more efficient conductive networks to be formed while permitting lower overall density of wires for a high transparency. In other words, when conductive nanowires with high aspect ratios are used, the density of the nanowires that achieves a conductive network can be low enough that the conductive network is substantially transparent.

Metal nanowires can be prepared by known methods in the art. In particular, silver nanowires can be synthesized through solution-phase reduction of a silver salt (e.g., silver nitrate) in the presence of a polyol (e.g., ethylene glycol) and poly(vinyl pyrrolidone). Large-scale production of silver nanowires of uniform size can be prepared and purified according to the methods described in U.S. Published Application Nos. 2008/0210052, 2011/0024159, 2011/0045272, and 2011/0048170, all in the name of Cambrios Technologies Corporation, the assignee of the present disclosure.

Conductive Network

A conductive network refers to a layer of interconnecting metal nanostructures (e.g., nanowire) that provide the electrically conductive media of a transparent conductor. Since electrical conductivity is achieved by electrical charge percolating from one metal nanostructure to another, sufficient metal nanowires must be present in the conductive network to reach an electrical percolation threshold and become conductive. The surface conductivity of the conductive network is inversely proportional to its surface resistivity, sometimes referred to as sheet resistance, which can be measured by known methods in the art. As used herein, "electrically conductive" or simply "conductive" corresponds to a surface resistivity of no more than $10^4 \Omega/\square$, or more typically, no more than $1,000\Omega/\square$, or more typically no more than $500\Omega/\square$, or more typically no more than $200\Omega/\square$. The surface resistivity depends on factors such as the aspect ratio, the degree of alignment, degree of agglomeration and the resistivity of the interconnecting metal nanostructures.

In certain embodiments, the metal nanostructures may form a conductive network on a substrate without a binder. In other embodiments, a binder may be present that facilitates adhesion of the nanostructures to the substrate. Suitable binders include optically clear polymers including, without limitation: polyacrylics such as polymethacrylates (e.g., poly(methyl methacrylate)), polyacrylates and polyacrylonitriles, polyvinyl alcohols, polyesters (e.g., polyethylene terephthalate (PET), polyester naphthalate, and polycarbonates), polymers with a high degree of aromaticity such as phenolics or cresol-formaldehyde (Novolacs®), polystyrenes, polyvinyltoluene, polyvinylxylene, polyimides, polyamides, polyamideimides, polyetherimides, polysulfides, polysulfones, polyphenylenes, and polyphenyl ethers, polyurethane (PU), epoxy, polyolefins (e.g. polypropylene, polymethylpentene, and cyclic olefins), acrylonitrile-butadiene-styrene copolymer (ABS), cellulosics, silicones and other silicon-containing polymers (e.g. polysilsesquioxanes and polysilanes), polyvinylchloride (PVC), polyacetates, polynorbornenes, synthetic rubbers (e.g., EPR, SBR, EPDM), and fluoropolymers (e.g., polyvinylidene fluoride, polytetrafluoroethylene (TFE) or polyhexafluoropropylene), copolymers of fluoroolefin and hydrocarbon olefin (e.g., Lumiflon®), and amorphous fluorocarbon polymers or copolymers (e.g., CYTOP® by Asahi Glass Co., or Teflon® AF by Du Pont).

"Substrate" refers to a non-conductive material onto which the metal nanostructure is coated or laminated. The substrate can be rigid or flexible. The substrate can be clear or opaque. Suitable rigid substrates include, for example, glass, polycarbonates, acrylics, and the like. Suitable flexible substrates include, but are not limited to: polyesters (e.g., polyethylene terephthalate (PET), polyester naphthalate, and polycarbonate), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, polyimides, silicones and other conventional polymeric films. Additional examples of suitable substrates can be found in, e.g., U.S. Pat. No. 6,975,067.

Typically, the optical transparence or clarity of the transparent conductor (i.e., a conductive network on a non-conductive substrate) can be quantitatively defined by parameters including light transmission and haze. "Light transmission" (or "light transmissivity") refers to the percentage of an incident light transmitted through a medium. In various embodiments, the light transmission of the conductive layer is at least 80% and can be as high as 98%. Performance-enhancing layers, such as an adhesive layer, anti-reflective layer, or anti-glare layer, may further contribute to reducing the overall light transmission of the transparent conductor. In various embodiments, the light transmission (T %) of the transparent conductors can be at least 50%, at least 60%, at least 70%, or at least 80% and may be as high as at least 91% to 92%, or at least 95%.

Haze (H %) is a measure of light scattering. It refers to the percentage of the quantity of light separated from the incident light and scattered during transmission. Unlike light transmission, which is largely a property of the medium, haze is often a production concern and is typically caused by surface roughness and embedded particles or compositional heterogeneities in the medium. Typically, haze of a conductive film can be significantly impacted by the diameters of the nanostructures. Nanostructures of larger diameters (e.g., thicker nanowires) are typically associated with a higher haze. In various embodiments, the haze of the transparent conductor is no more than 10%, no more than 8%, or no more than 5% and may be as low as no more than 2%, no more than 1%, or no more than 0.5%, or no more than 0.25%.

Coating Composition

The patterned transparent conductors according to the present disclosure are prepared by coating a nanostructure-containing coating composition on a non-conductive substrate. To form a coating composition, the metal nanowires are typically dispersed in a volatile liquid to facilitate the coating process. It is understood that, as used herein, any non-corrosive volatile liquid in which the metal nanowires can form a stable dispersion can be used. Preferably, the metal nanowires are dispersed in water, an alcohol, a ketone, ethers, hydrocarbons or an aromatic solvent (benzene, toluene, xylene, etc.). More preferably, the liquid is volatile, having a boiling point of no more than 200° C., no more than 150° C., or no more than 100° C.

In addition, the metal nanowire dispersion may contain additives and binders to control viscosity, corrosion, adhesion, and nanowire dispersion. Examples of suitable additives and binders include, but are not limited to, carboxy methyl cellulose (CMC), 2-hydroxy ethyl cellulose (HEC), hydroxy propyl methyl cellulose (HPMC), methyl cellulose (MC), poly vinyl alcohol (PVA), tripropylene glycol (TPG), and xanthan gum (XG), and surfactants such as ethoxylates, alkoxylates, ethylene oxide and propylene oxide and their copolymers, sulfonates, sulfates, disulfonate salts, sulfosuccinates, phosphate esters, and fluorosurfactants (e.g., Zonyl® by DuPont).

In one example, a nanowire dispersion, or "ink" includes, by weight, from 0.0025% to 0.1% surfactant (e.g., a preferred range is from 0.0025% to 0.05% for Zonyl® FSO-100), from 0.02% to 4% viscosity modifier (e.g., a preferred range is 0.02% to 0.5% for HPMC), from 94.5% to 99.0% solvent and from 0.05% to 1.4% metal nanowires. Representative examples of suitable surfactants include Zonyl® FSN, Zonyl® FSO, Zonyl® FSH, Triton (x100, x114, x45), Dynol (604, 607), n-Dodecyl b-D-maltoside and Novek. Examples of suitable viscosity modifiers include hydroxypropyl methyl cellulose (HPMC), methyl cellulose, xanthan gum, polyvinyl alcohol, carboxy methyl cellulose, and hydroxy ethyl cellulose. Examples of suitable solvents include water and isopropanol.

The nanowire concentration in the dispersion can affect or determine parameters such as thickness, conductivity (including surface conductivity), optical transparency, and mechanical properties of the nanowire network layer. The percentage of the solvent can be adjusted to provide a desired concentration of the nanowires in the dispersion. In preferred embodiments the relative ratios of the other ingredients, however, can remain the same. In particular, the ratio of the surfactant to the viscosity modifier is preferably in the range of about 80 to about 0.01; the ratio of the viscosity modifier to the metal nanowires is preferably in the range of about 5 to about 0.000625; and the ratio of the metal nanowires to the surfactant is preferably in the range of about 560 to about 5. The ratios of components of the dispersion may be modified depending on the substrate and the method of application used. The preferred viscosity range for the nanowire dispersion is between about 1 and 100 cP.

Following the coating, the volatile liquid is removed by evaporation. The evaporation can be accelerated by heating (e.g., baking). The resulting nanowire network layer may require post-treatment to render it electrically conductive. This post-treatment can be a process step involving exposure to heat, plasma, corona discharge, UV-ozone, or pressure as described below.

Examples of suitable coating compositions are described in U.S. Published Application Nos. 2007/0074316, 2009/0283304, 2009/0223703, and 2012/0104374, all in the name of Cambrios Technologies Corporation, the assignee of the present disclosure.

The coating composition is coated on a substrate by, for example, sheet coating, web-coating, printing, and lamination, to provide a transparent conductor. Additional information for fabricating transparent conductors from conductive nanostructures is disclosed in, for example, U.S. Published Patent Application No. 2008/0143906, and 2007/0074316, in the name of Cambrios Technologies Corporation.

Patterning Transparent Conductor

As used herein, "patterning" broadly refers to a process that creates conductive lines and insulating regions. "Patterning" does not necessarily create any repeating features other than that any two conductive lines be electrically isolated from each other by an insulating region. Typically, the conductive lines extend in substantially the same lengthwise directions, even if they have irregular non-conductive boundaries (see, e.g., FIG. 4).

Patterning also provides conductive material islands within the insulating regions. As discussed herein, the conductive material islands may or may not have regular or repeating shapes, and may have the same or different surface areas. However, the insulating region is considered "patterned" so long as the conductive material islands are electrically isolated from each other by non-conductive gaps.

Thus, a "patterned" transparent conductor defines an arrangement of conductive lines and insulating regions having islands. As used herein, the patterns of the transparent conductor described herein are invisible or have low visibility because the conductive lines and the insulating regions have substantially the same light scattering or haze. In particular, any difference in haze, which corresponds to light scattering, should be less than 1%, or more typically, less than 0.5%, or less than 0.1%, or less than 0.01%.

Patterning may be carried out by direct printing, laser ablation or etching, all of which involve coating a nanostructure-containing coating composition. In certain embodiments, the coating composition may be directly printed on the substrate according to a desired pattern, i.e., an arrangement of conductive lines and insulating regions having islands. Suitable printing methods may include, for example, screen printing. Thus, one embodiment provides a process of fabricating a transparent conductor with a low-visibility pattern. The method comprises: directly printing a coating composition on a non-conductive substrate according to a pattern, the coating composition having a plurality of metal nanostructures and a volatile liquid carrier, and removing the volatile liquid carrier, wherein the pattern defines a first conductive line having a first lengthwise direction on the non-conductive substrate; a second conductive line having a second lengthwise direction on the non-conductive substrate, and an insulating region electrically isolating the first conductive line from the second conductive line, the insulating region having a first non-conductive boundary laterally abutting the first conductive line along the first lengthwise direction and a second non-conductive boundary laterally abutting the second conductive line along the second lengthwise direction, wherein the insulating region comprises a plurality of conductive material islands disposed on the non-conductive substrate and electrically isolated from each other by non-conductive gaps, each conductive material island comprising a respective plurality of conductive nanostructures, and wherein the non-conductive gaps and the first and second non-conductive boundaries do not have any metal nanostructures.

In certain embodiments, non-conductive boundaries and the non-conductive gaps are etched in sequential steps (e.g., using two different masks). In other embodiments, they are etched in a single step (e.g., using one mask).

In a further embodiment, the pattern is created by first coating metal nanostructures followed by etching the metal nanostructures to form the non-conductive areas, including non-conductive boundaries and non-conductive gaps between islands. More specifically, the method comprises: coating a coating composition on a non-conductive substrate, the coating composition having a plurality of metal nanostructures and a volatile liquid carrier; removing the volatile liquid carrier to provide a conductive network of metal nanostructures; and etching the conductive network according to a pattern, wherein the pattern defines a first conductive line having a first lengthwise direction on the non-conductive substrate; a second conductive line having a second lengthwise direction on the non-conductive substrate, and an insulating region electrically isolating the first conductive line from the second conductive line, the insulating region having a first non-conductive boundary laterally abutting the first conductive line along the first lengthwise direction and a second non-conductive boundary laterally abutting the second conductive line along the second lengthwise direction, wherein the insulating region comprises a plurality of conductive material islands disposed on the non-conductive substrate and electrically isolated from each other by non-conductive gaps, each conductive material island comprising a respective plurality of conductive nanostructures, and wherein the non-conductive gaps and the first and second non-conductive boundaries do not have a conductive network of the metal nanostructures.

In certain embodiments, the non-conductive gaps and the first and second non-conductive boundaries are fully etched such that no metal nanostructures are present.

Typically, an etching solution can be screen-printed on the nanostructure-coated substrate through a mask, the mask defining the conductive lines and the islands. Thus, the etching provides the non-conductive areas, including the non-conductive gaps and the first and second non-conductive boundaries. Suitable etching solutions typically contain a strong acid (e.g., $HNO_3$) and optionally one or more oxidizing agents (e.g., $KMnO_4$). Examples of suitable etching solutions include those described in U.S. Published Patent Application No. 20080143906, in the name of Cambrios Technologies Corporation.

In other embodiments, the non-conductive gaps and the first and second non-conductive boundaries are partially etched such that the metal nanostructures are broken or nicked and do not form a conductive network. Etching solutions that are capable of partially etching the metal nanostructures are described in U.S. Published Patent Application Nos. 20100243295, and 2011/0253668, in the name of Cambrios Technologies Corporation.

The transparent conductor structures, their electrical and optical properties, and the methods of patterning are illustrated in more detail by the following non-limiting examples.

EXAMPLES

Example 1

Synthesis of Silver Nanowires

Silver nanowires were synthesized by the reduction of silver nitrate dissolved in ethylene glycol in the presence of poly(vinyl pyrrolidone) (PVP) following the "polyol" method described in, e.g., Y. Sun, B. Gates, B. Mayers, & Y. Xia, "Crystalline silver nanowires by soft solution processing", *Nanoletters*, (2002), 2(2) 165-168. A modified polyol method, described in U.S. application Ser. No. 11/766,552, in the name of Cambrios Technologies Corporation, produces more uniform silver nanowires at higher yields than does the conventional "polyol" method. This application is incorporated by reference herein in its entirety.

Example 2

Low-Visibility Patterning

A suspension of HPMC, silver nanowires and water was prepared. The suspension was spin-coated on a glass substrate to form a thin conductive film of silver nanowires in a HPMC matrix. The conductive layer was optically clear, with an optical transmission (% T) of about 88.1% and haze (% H) of about 2.85%. The conductive layer is also highly surface-conductive with a surface resistivity of about 25Ω/□.

Thereafter, a region of the conductive film was treated with an oxidizing agent, e.g., a bleach solution having 0.5% hypochlorite, for 2 minutes. The treated film was then rinsed with water and dried in a nitrogen atmosphere. The treated region of the film showed substantially the same transmission (89.1% T) and haze (5.85% H) as compared to the optical properties of the untreated region. The treated region and the untreated region were visually uniform.

The surface resistivity of the treated region, however, has increased by several orders of magnitude and become effectively insulating. Further the silver nanowires were broken or were likely to have been converted to an insoluble and insulating silver salt such as silver chloride.

A silver nanowire-based conductive film was treated with a stronger and more concentrated oxidizing agent: 30% hydrogen peroxide. In the treated region, nearly all of the nanowires and the organic HPMC matrix were dissolved. The optical properties in the treated region and the untreated region were notably different.

Example 3

Photoresist Patterning Method

A silver nanowire dispersion was prepared consisting of 0.2% HPMC, 250 ppm TritonX100 and silver nanowires. The dispersion was spin-coated onto a substrate and baked for 90 seconds at 180° C. This nanowire film was then spin-coated with AZ-3330F photoresist to make a 2.5 μm transparent conducting film. The transparent conductor was then baked at 110° C. for 60 seconds. A photomask was placed in contact with a portion of the photoresist layer and the transparent conductor was exposed to light for 20 seconds at 12 mW/cm². The conductor was then baked for 60 seconds at 110° C.

The photoresist was then developed with AZ300MIF developer, rinsed and spun dry. The conductor was then exposed to Transene silver etchant for 10 seconds, rinsed and spun dry. The photoresist was then stripped using Acetone. The transparent conductor was overcoated with Polyset PCX35-39B at 2.5% dilution in PGME and then cured for 45 min. at 180° C. The resulting patterned transparent conductor had a line-width of from 5 μm to 10 μm. Larger pattern line-widths have also been obtained using photoresist and other patterning methods disclosed herein. For example, line-widths from 10 μm to 300 μm and 10 μm to 50 μm have been obtained.

Example 4

Low-Visibility Patterning by Copper Chloride Etchant

An etchant solution was prepared by mixing 240 g of $CuCl_2.2H_2O$ with 180 g of concentrated HCl (37% w/w) and 580 g of water. The final concentration of $CuCl_2$ is about 19% and HCl is 6.8%.

A conductive film of silver nanowires was prepared according to the methods described herein. The conductive film was etched and it could be observed that the two regions showed little difference in optical properties, yet the etched region was less conductive and had a resistivity of about 20,000 Ω/sq.

Example 5

Low-Visibility Patterning—Etching by Heating

Example 5 demonstrates creating a low-visibility pattern in a conductive film by combining a partial etching step and a subsequent heating step. As discussed herein, the heating completes the etching by further rendering the etched region non-conductive or less conductive.

Table 1 shows that a heating step of alone actually increases the conductivity of an unetched conductive film. In Trials A and B, conductive films (or samples) were heated for five and thirty minutes, respectively, and their sheet resistivities ($R_s$) were reduced by between 5 and 10 percent.

TABLE 1

|  |  | Heating Step |
|---|---|---|
| Trial A | $R_s$ (t = 0) | $R_s$ (t = 5 min at 130° C.) |
|  | 106 Ω/sq | 94.5 Ω/sq |
| Trial B | $R_s$ (t = 0) | $R_s$ (t = 30 min at 130° C.) |
|  | 106 Ω/sq | 98.5 Ω/sq |

Table 2 shows the effect of heating on a partially etched sample. In the three trials listed, the samples were chemically etched using a $CuCl_2$ etchant (as described in Example 18) until their sheet resistivity was approximately 1000 Ω/sq. They were then heated for up to five minutes but also as little as one minute at 130° C. In each trial, the heating step was sufficient to render the sample non-conductive. In other words, the damage of the nanowire network that was initially caused by the etching process was completed by the heating process.

TABLE 2

|  |  | Etching Step | Heating Step |
|---|---|---|---|
| Trial C | $R_s$ (t = 0) | $R_s$ (t = 90 s in etch bath at roughly 36° C.) | $R_s$ (t = 5 min at 130° C.) |
|  | 106 Ω/sq | 1000 Ω/sq | Not conductive |
| Trial D | $R_s$ (t = 0) | $R_s$ (t = 70 s in etch bath at roughly 40° C.) | $R_s$ (t = 5 min at 130° C.) |
|  | 121 Ω/sq | 1200 Ω/sq | Not conductive |
| Trial E | $R_s$ (t = 0) | $R_s$ (t = 120 s in etch bath at roughly 32° C.) | $R_s$ (t = 1 min at 130° C.) |
|  | 121 Ω/sq | 1000 Ω/sq | Not conductive |

Table 3 shows that if the initial chemical etching step is insufficient, i.e., the damage to the nanowires is insufficient, it becomes difficult to make the samples non-conductive even with a subsequent heating step. In Trial F, a sample was etched until its resistance had changed from 108 to 120 Ω/sq. Subsequent heating for one minute at 130° C. did not change the sample resistance. In Trial G, another sample was etched until its resistance had changed from 121 to 198 Ω/sq. Subsequent heating at 130° C. for up to twenty-five minutes did continually increase the sample's resistivity; however, the sheet resistance failed to go beyond 685 Ω/sq. This shows that it is important for the initial partial etching to cause an etched region to reach a threshold resistivity (which is indicative of the extent of damage to the nanostructures) in order for the heating step to complete the etching.

TABLE 3

|  |  | Etching Step |  | Heating Step(s) |  |  |
|---|---|---|---|---|---|---|
| Trial F | $R_s$ (t = 0) | $R_s$ (t = 60 s in etch bath at roughly 33° C.) |  | $R_s$ (t = 1 min at 130° C.) |  |  |
|  | 108 Ω/sq | 120 Ω/sq |  | 122 Ω/sq |  |  |
| Trial G | $R_s$ (t = 0) | $R_s$ (t = 90 s in etch bath at roughly 32° C.) |  | $R_s$ (t) at 130° C. |  |  |
|  |  | t(min) | 1 | 2 | 5 | 15 | 25 |
|  | 121 Ω/sq | 198 Ω/sq | $R_s$ | 310 | 340 | 450 | 600 | 685 |

Table 4 compares the optical properties of two patterned samples: the sample in Trial I was etched chemically (by a $CuCl_2$ etchant) to be non-conductive and the sample in Trial H was partially etched followed by heating.

In Trial H, an initial partial etching brought the resistivity from 105 Ω/sq to 602 Ω/sq, which was sufficient for a subsequent heating step to make the sample non-conductive. As shown, the final optical properties were nearly identical to the initial properties of the sample (prior to etching), i.e., the difference in haze (H %) being about 0.01%, the difference in transmission (T %) being 0.1%. The sample had low-visibility patterns.

In Trial I, the sample was etched to be fully non-conductive. Here, although the transmission remained the same before and after the etching, the haze had decreased by about 0.07%, as compared to the pre-etching haze value. The bigger difference between the haze of etched and unetched areas of the film of Trial I (as compared to Trial H) makes the etched areas more visible that those of Trial H.

TABLE 4

|  |  | Rs | % T | % H |
|---|---|---|---|---|
| Trial H |  t = 0 | 105 Ω/sq | 91.8 | 1.18 |
| Etched Then Heated to | Etched 180 s at 30° C. | 602 Ω/sq | 91.7 | 1.27 |
| Non-Conductivity | Then Heated 90 s at 130° C. | Not conductive | 91.7 | 1.19 |
| Trial I | t = 0 | 103 Ω/sq | 91.8 | 1.15 |
| Etched to Non-Conductivity | Etched 180 s at 32° C. | Not conductive | 91.8 | 1.08 |

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention.

The invention claimed is:

1. A patterned transparent conductor comprising:
    a non-conductive substrate,
    a first conductive line on the non-conductive substrate, the first conductive line comprising a first network of conductive nanostructures and having a first lengthwise direction;
    a second conductive line on the non-conductive substrate, the second conductive line comprising a second network of conductive nanostructures and having a second lengthwise direction; and
    an insulating region electrically isolating the first conductive line from the second conductive line, the insulating region having a first non-conductive boundary laterally abutting the first conductive line along the first lengthwise direction and a second non-conductive boundary laterally abutting the second conductive line along the second lengthwise direction, wherein the insulating region comprises a plurality of conductive material islands disposed on the non-conductive substrate and electrically isolated from each other by non-conductive gaps, each conductive material island comprising a respective plurality of conductive nanostructures, and wherein the non-conductive gaps, the first and second non-conductive boundaries do not have any conductive network of metal nanostructures.

2. The patterned transparent conductor of claim 1 wherein the first lengthwise direction and the second lengthwise direction are substantially parallel to each other.

3. The patterned transparent conductor of claim 1 wherein the first non-conductive boundary is straight.

4. The patterned transparent conductor of claim 1 wherein the second non-conductive boundary is straight.

5. The patterned transparent conductor of claim 1 wherein the first non-conductive boundary is irregular.

6. The patterned transparent conductor of claim 5 wherein the second non-conductive boundary is straight.

7. The patterned transparent conductor of claim 1 wherein the conductive material islands are parallelogram-shaped.

8. The patterned transparent conductor of claim 1 wherein the conductive material islands are irregular-shaped.

9. The patterned transparent conductor of claim 1 wherein the conductive material islands have surface areas that are within the range of 0.1-10 $mm^2$ or 0.5-2 $mm^2$.

10. The patterned transparent conductor of claim 1 wherein no metal nanostructures are present in the non-conductive gaps, the first and second non-conductive boundaries.

11. The patterned transparent conductor of claim 1 wherein the non-conductive gaps, the first and second non-conductive boundaries have metal nanostructures with structural defects that render them incapable of forming a conductive network.

12. A process of fabricating a transparent conductor with a low-visibility pattern, the process comprising:

directly printing a coating composition on a non-conductive substrate according to a pattern, the coating composition having a plurality of metal nanostructures and a volatile liquid carrier; and removing the volatile liquid carrier, wherein, the pattern defines a first conductive line having a first lengthwise direction on the non-conductive substrate; a second conductive line having a second lengthwise direction on the non-conductive substrate, and an insulating region electrically isolating the first conductive line from the second conductive line, the insulating region having a first non-conductive boundary laterally abutting the first conductive line along the first lengthwise direction and a second non-conductive boundary laterally abutting the second conductive line along the second lengthwise direction, wherein, the insulating region comprises a plurality of conductive material islands disposed on the non-conductive substrate and electrically isolated from each other by non-conductive gaps, each conductive material island comprising a respective plurality of conductive nanostructures, and wherein the non-conductive gaps, the first and second non-conductive boundaries do not have any metal nanostructures.

13. The process of claim 12 wherein and wherein the non-conductive gaps, the first and second non-conductive boundaries do not have any metal nanostructures.

14. A process of fabricating a transparent conductor with a low-visibility pattern, the process comprising:

coating a coating composition on a non-conductive substrate, the coating composition having a plurality of metal nanostructures and a volatile liquid carrier;

removing the volatile liquid carrier to provide a conductive network of metal nanostructures; and etching the conductive network according to a pattern, wherein, the pattern defines a first conductive line having a first lengthwise direction on the non-conductive substrate; a second conductive line having a second lengthwise direction on the non-conductive substrate, and an insulating region electrically isolating the first conductive line from the second conductive line, the insulating region having a first non-conductive boundary laterally abutting the first conductive line along the first lengthwise direction and a second non-conductive boundary laterally abutting the second conductive line along the second lengthwise direction, wherein, the insulating region comprises a plurality of conductive material islands disposed on the non-conductive substrate and electrically isolated from each other by non-conductive gaps, each conductive material island comprising a respective plurality of conductive nanostructures, and wherein the non-conductive gaps, the first and second non-conductive boundaries do not have a conductive network of the metal nanostructures.

15. The process of claim 14 wherein the etching completely removes all of the metal nanostructures in the non-conductive gaps, the first and second non-conductive boundaries.

16. The process of claim 14 wherein the etching partially etches the metal nanostructures in the non-conductive gaps, the first and second non-conductive boundaries to cause structural defects.

* * * * *